United States Patent [19]

Kennedy et al.

[11] Patent Number: 4,866,779

[45] Date of Patent: Sep. 12, 1989

[54] ADAPTIVE AM AUDIO PROCESSOR

[75] Inventors: Richard A. Kennedy, Russiaville; Seyed R. Zarabadi, Kokomo; Fred J. Anderson, Kokomo; Marvin G. Stang, Kokomo, all of Ind.

[73] Assignee: Delco Electronics Corporation, Kokomo, Ind.

[21] Appl. No.: 218,636

[22] Filed: Jul. 13, 1988

[51] Int. Cl.⁴ .......................................... H04B 15/00
[52] U.S. Cl. ...................................... 381/94; 381/15; 381/13; 455/266; 455/340; 333/173
[58] Field of Search ................... 333/173; 381/15, 13, 381/94; 455/266, 340

[56] References Cited

U.S. PATENT DOCUMENTS

| | | | |
|---|---|---|---|
| 3,795,877 | 3/1974 | Poole | 333/173 |
| 4,518,935 | 5/1985 | Van Roermund | 333/173 |
| 4,520,283 | 5/1985 | Sasaki et al. | 333/173 |
| 4,680,795 | 7/1987 | Ecklund | 381/15 |

Primary Examiner—Forester W. Isen
Attorney, Agent, or Firm—A. Frank Duke

[57] ABSTRACT

An audio processor for adaptively rejecting undesired noise and interference in an audio input which includes a variable Q, 10 kHz switched capacitor notch filter. The Q of the notch filter is varied by a control loop responsive to the 10 kHz content of the audio signal. The notch filter includes a summer section that is clocked at a predetermined frequency, and an integrator section which is clocked at a multiple of the predetermined frequency in order to prevent center frequency variation with changes in Q of the notch filter.

6 Claims, 5 Drawing Sheets

ADAPTIVE AM AUDIO PROCESSOR

FIELD OF THE INVENTION

This invention relates to AM receivers and more particularly to an audio processor which adaptively responds to adverse reception conditions to filter out undesired noise and interference, particularly high frequency "whistle" and sideband "monkey chatter", while providing full audio fidelity when such conditions are not present.

BACKGROUND OF THE INVENTION

Recent advances in AM broadcast transmission and reception, such as AM stereo, have spurred the development of wider bandwidth, "higher fidelity" AM receivers. These receivers represent a significant improvement in terms of audio frequency response over their narrow-bandwidth counterparts. Under very good signal conditions (typically within 50 miles of the transmitter), these receivers can reproduce transmitted frequency components in the 6 to 12 kHz range without adverse effects from adjacent channel transmitter occupancy at +−10 kHz. However, under reception conditions where adjacent channel signal strengths are comparable to the desired signal, the wider bandwidth receivers pass objectionable 10 kHz "whistle" and "monkey chatter". In addition, random noise which becomes noticeable under very weak signal reception (independent of any adjacent channel interference) makes a wide receiver bandwidth unacceptable under "deep fringe" conditions. This has led receiver manufacturers to include fixed 10 kHz notch filters and selectable wide/narrow IF bandwidth in typical AM stereo receivers.

Typical implementations of 10 kHz notch filters and selectable IF bandwidths in current AM receivers have significant disadvantages and performance deficiencies. For example, notch filters typically constructed with passive inductive, capacitive, and resistive components, have Q value limitations of 7 to 8 because of component tolerances and allowable temperature drift. This attenuated frequency spectra includes much more than 10 kHz, and can significantly limit reproduction of transmitted audio components in the 8–12 kHz range. Also, the maximum IF bandwidth of the receiver is dictated not by audio fidelity, but by maintenance of a reasonable RF protection ratio under low to moderate adjacency conditions. It is therefore a listenability compromise in terms of both ultimate "fidelity" and adjacent channel interference rejection. Listener selectable IF bandwidths provide protection from adjacent channel interference, but are poor in terms of user interface because they offer only two manually selectable bandwidth alternatives. As signal strength decreases, background noise tends to limit the signal to noise ratio (S/N) of high frequency modulation components in a given listening situation. The listener is often forced to switch to the narrower IF bandwidth even though no adjacencies may be present.

The main disadvantage of 10 kHz notch filters and IF bandwidths in current AM receivers is, then, their fixed or manual nature, constrained by adequate RF protection ratios. The listener is not afforded totally "automatic" adjustment of audio response to which he is accustomed in typical automotive FM receivers. Also, the fidelity limitations and the lack of flexibility previously mentioned do not allow a receiver's audio response to be continuously optimized.

SUMMARY OF THE INVENTION

The present invention provides a method of automatically and continuously adapting the AM receiver's audio response and effective selectivity to reception conditions. Used in a receiver equipped with synchronous detection, the present invention monitors the presence of adjacencies and applies sufficient selectivity to attenuate any noise, or "monkey-chatter" present. At the same time, the present invention allows the receiver to be designed with much greater ultimate fidelity for maximum frequency response under good reception conditions. In accordance with the present invention the selectivity or Q of a 10 kHz notch filter is varied as a function of the amount of audio signal energy at the 10 kHz center frequency without affecting the or shifting the center frequency. In a preferred embodiment control is accomplished by utilizing the bandpass output of a 10 kHz switched capacitor notch filter as an indication of the amount of 10 kHz content in the audio signal and converting the bandpass output signal to a binary pattern which is used to control the bandwidth or Q of a notch filter. The notch filter includes a summer section which is clocked from a relatively low frequency clock source while the integrator section of the notch filter, which isolates the 10 kHz content of the audio, is clocked from a higher frequency clock which is a multiple of the low frequency clock. This is done to insure that variation in Q do not affect the 10 kHz center frequency.

BRIEF DESCRIPTION OF THE DRAWINGS

A more complete understanding of the present invention may be had from the following detailed description which should be read in conjunction with the drawings in which.

DESCRIPTION OF THE PREFERRED EMBODIMENT

Figure 1:
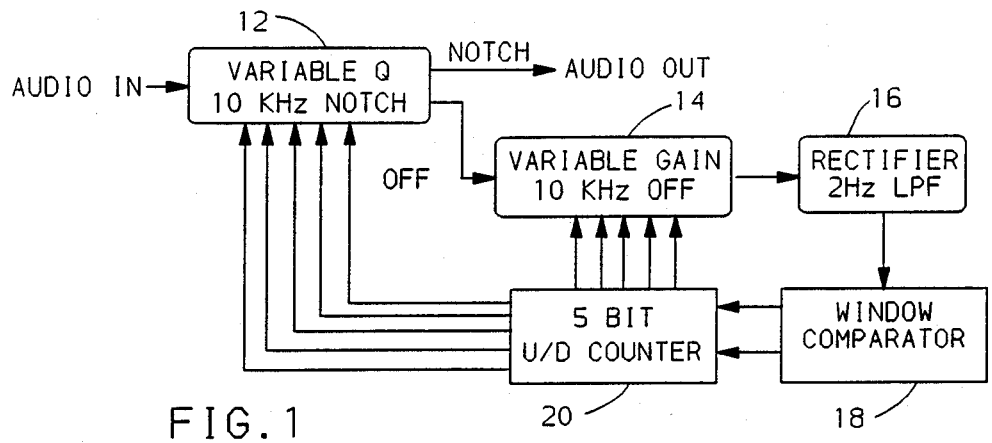
FIG. 1 is a block diagram of the audio processor of the present invention.

Referring now to the drawings and initially to FIG. 1 the audio processor of the present invention includes a variable Q, 10 kHz notch filter 12 which receives an audio input from the output of a detector or AM Stereo decoder (not shown). This is the audio which would normally be routed to the receiver final audio output section. The signal is applied to the notch filter 12, which is adaptively controlled by the other circuit blocks. The filter 12 applies a notch function with varying Q (or sharpness) to the audio signal to produce the audio output, and also provides a bandpass function for the same 10 kHz which is being rejected in the audio path. The bandpass function is inherent in the notch filter structure and appears at the output designated BPF.

The bandpass output of the filter 12 is routed to a variable gain 10 kHz bandpass filter 14. The output signal of the bandpass filter 14 is routed to a lowpass filter block 16 which rectifies the input to create a dc voltage proportional to the ac signal.

The dc voltage at the output of the block 16 is directly proportional to the amount of 10 kHz component in the input signal. The relative value of the signal is sensed by a window comparator 18 which generates direction control and clock enable signals for a Up/Down counter block 20 according to the relationship of the input voltage to upper (Vmax) and lower (Vmin) reference voltages of the comparator 18. The counter block 20 provides a 5 bit binary output which sets the Q of the notch filter 12 and the gain of the filter 14. The gain of the filter 14 may be varied, for example, from a maximum of 26 dB to a minimum of 0 dB in order to keep the loop gain constant under all 10 kHz noise input levels. Thus, while the output of the block 16, designated 22, instantaneously responds to a change in the amplitude of the 10 kHz input to filter 14, the negative feedback loop will force the dc voltage to a constant value within the window established by the upper and lower reference voltages.

Figure 2:
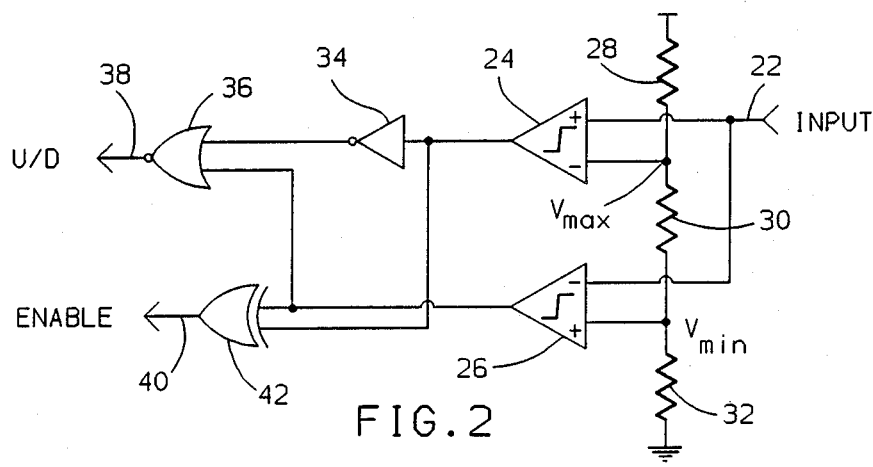
FIG. 2 is a more detailed schematic of the window comparator of FIG. 1.

As shown in FIG. 2, the window comparator 18 receives the dc signal from the filter 16. The dc signal is applied to the positive input of a comparator 24 and to the negative input of a comparator 26. Voltage divider resistors 28, 30, 32 establish upper and lower reference voltages designated Vmax and Vmin which may for example be 1.65 volts and 1.55 volt respectively. Vmax is connected to the negative input of the comparator 24 while Vmin is connected to the positive input of comparator 26. The output of comparators 24 is inverted by inverter 34 and applied to the input of NOR gate along with the output of comparator 26. When the input signal at node 22 is at its maximum value the output of comparator 24 is high and the output of comparator 26 is low producing a high signal on the U/D output. When the input signal is at a minimum value, the opposite is true and U/D is low. The clock enable output 40 from the Exclusive OR gate 42 is high when the output of either one or the other of the comparators 24, 26 is high.

Figure 3:
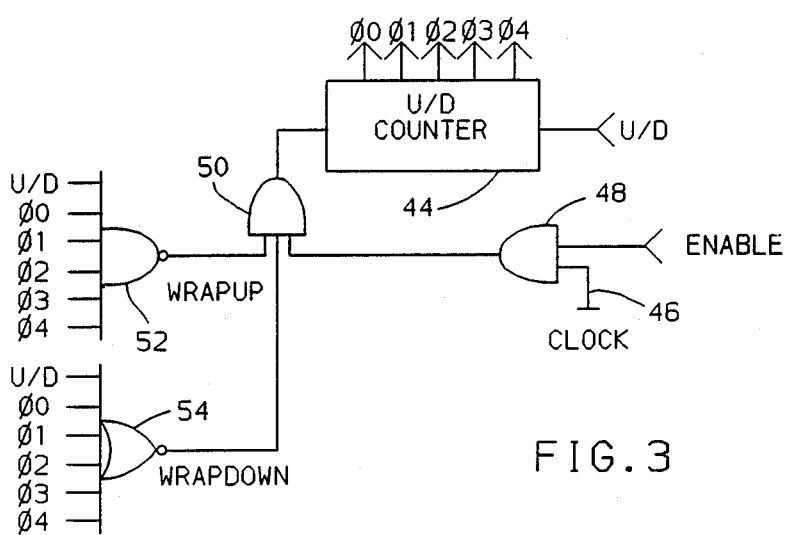
FIG. 3 is a more detailed schematic of the up/down counter of FIG. 1, showing the control logic.

As shown in FIG. 3, an Up/Down counter 44 is clocked from an input 46 through AND gates 48, 50 and produces a 5 bit binary output on the lines $\phi 0-\phi 4$. When the U/D direction control input is high the counter 44 counts up and when the direction control input is low the counter 44 counts down. A wrapup control is applied to the gate 50 from the NAND gate 52 and a wrapdown control is applied is applied to the gate 50 from the NOR gate 54. Wrapup disables the clock input to the counter 44 at 11111 and wrapdown disables the clock input to the counter 44 at 00000.

The minimum and maximum values the input signal on conductor 22 are identically equal to Vmax and Vmin because of the closed-loop nature of the control system. As the signal tries to exceed Vmax, for example, the U/D direction control signal changes and the counter starts counting down so that the bit pattern applied to the bandpass filter 14 reduces its gain. The input signal at 22 is then reduced, dropping below both Vmax and Vmin. The process again resumes as the control loop reverses, sending the input signal above Vmax. Under conditions when the 10 kHz level is not varying, the circuit toggles between count-up and count-down states. If the 10 kHz content is at either extreme, the control loop stops at either maximum or minimum gain due the inhibiting effect of wrapup or wrapdown.

Figure 4:
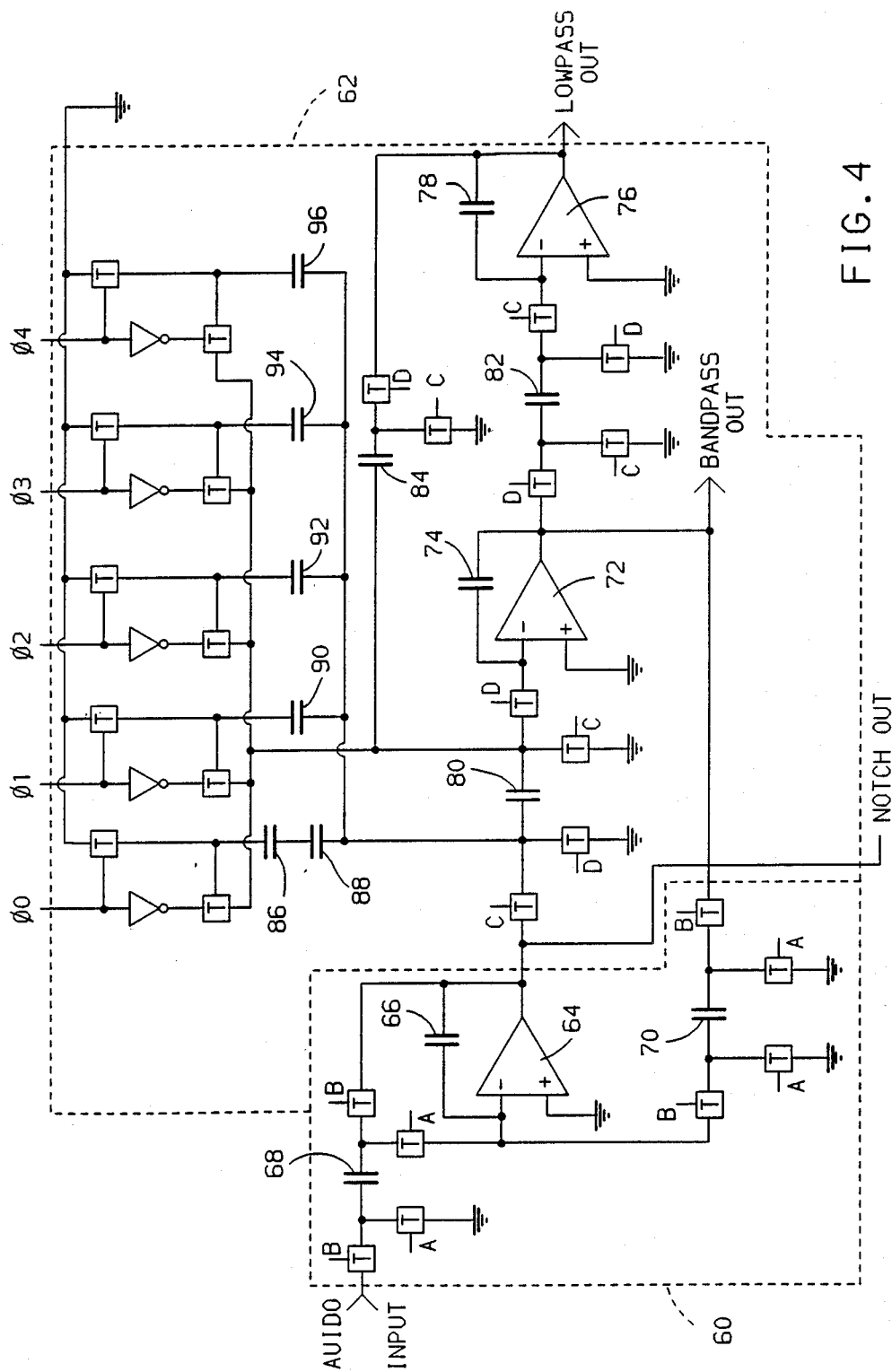
FIGS. 4, 6 and 8 are switched capacitor implementations of the filters of the processor of FIG. 1.
Figure 5:
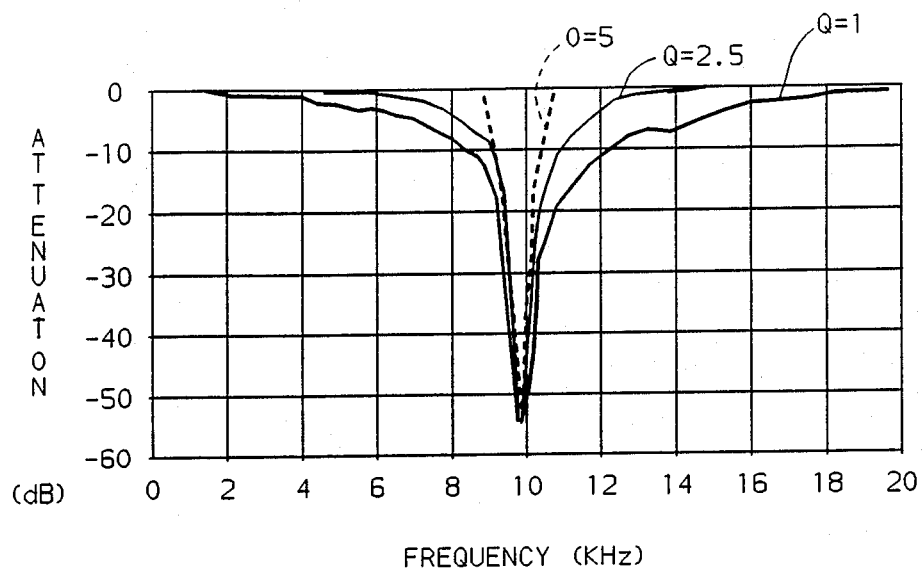
FIG. 5 is a graph showing the response of the notch filter of FIG. 4, for three nominal Q settings.

Referring now to FIG. 4, a switched capacitor variable Q notch filter 12 is shown and comprises a relatively low speed summer section 60 and a relatively high speed integrator section 62. The summer section 60 includes an amplifier 64 and a 5 picofarad (pf) feedback capacitor 66 and provides a notch output. Non overlapping clock signals designated A and B are 180 degrees out of phase with each other and are applied to CMOS transmission gates (electronic switches) T, in the summer section 60, to control the switching of 5 pf capacitors 68 and 70. The integrator section 62 comprises an amplifier 72 and a 5 pf feedback capacitor and provides a bandpass output which is designated BPF in FIG. 1 and is fed back to the summer 60 to establish the rejection band of the notch filter. The section 62 further comprises an amplifier 76 and a 5 pf capacitor 78 which provides a lowpass output. Non overlapping clock signals C and D are in phase with A and B respectively and are applied to the electronic switches T, in the integrator section 62 to control a 0.1 pf capacitor 80, and 1.39 pf capacitors 82 and 84. The Q of the filter 14 is controlled by varying the capacitive coupling between the summer section 60 and the integrator section 62. In the embodiment shown in FIG. 4, this capacitive coupling is varied through control of a bank of capacitors designated 86, 88–96 which are selectively connectable in parallel with the capacitor 80. The capacitors 86, 88 are serially connected 0.08 pf capacitors to produce an equivalent capacitance of 0.04 pf. The serially connected capacitors 86, 88 are connected in parallel with capacitors 90–96 having values of 0.08 pf, 0.16 pf, 0.32 pf and 0.64 pf respectively. The value of the capacitance in parallel with the capacitor 80 depends on the binary pattern or digital word $\phi 0-\phi 4$ applied to the CMOS transmission gates directly or through inverters as shown. When the digital word is 11111 all capacitors in the bank are grounded and the capacitor 80 establishes a Q of approximately 20 producing a relatively narrow notch width. When the digital word is 00000 the capacitor added in parallel with capacitor 80, increases the total capacitance and reduces the Q to approximately 1 and the width of notch is relatively wide. Thus, the capacitors 90–92 and the 0.04 pf capacitance formed by capacitors 86, 88 are selectively connected in parallel with the capacitor 108 to effect the appropriate Q setting. A typical notch response for three Q settings of 1, 2.5 and 5 is shown in FIG. 5. For a Q of 20 the bandwidth would extend from approximately 250 Hz on either side of the 10 kHz center frequency.

As indicated previously, the summer 60 is clocked from a relatively low frequency clock source A,B of, for example, 45 kHz. The integrator 62 is clocked from relatively high frequency clock source C, D which must be a multiple of the A, B clock, for example, 225 kHz. The use of relatively low and relatively high clock sources in the two sections 60 and 62 respectively, permits greater control and resolution and is necessary in order to be able to vary the Q of the notch filter without affecting the center frequency of the notch filter. It can be shown that the center frequency variation, that occurs with changes in the capacitor bank configuration as a result of changing bit patterns, is inversely proportional to the ratio of the period of the integrator stage sampling clock C, D to the period of the summer stage sampling clock A, B. Consequently the frequency of the C, D clock must be a multiple of the A, B clock and the higher the multiple the less will be the center frequency variation as Q changes. It should also be noted that a relatively low clocking rate is desirable for the summer section 60 in order to achieve a high signal to noise ratio. Thus, while it is possible to achieve comparable results with a single clock operating at about 100 time the center frequency, such an approach has serious drawback which are alleviated by the two clocking rates employed in the present invention.

Figure 7:
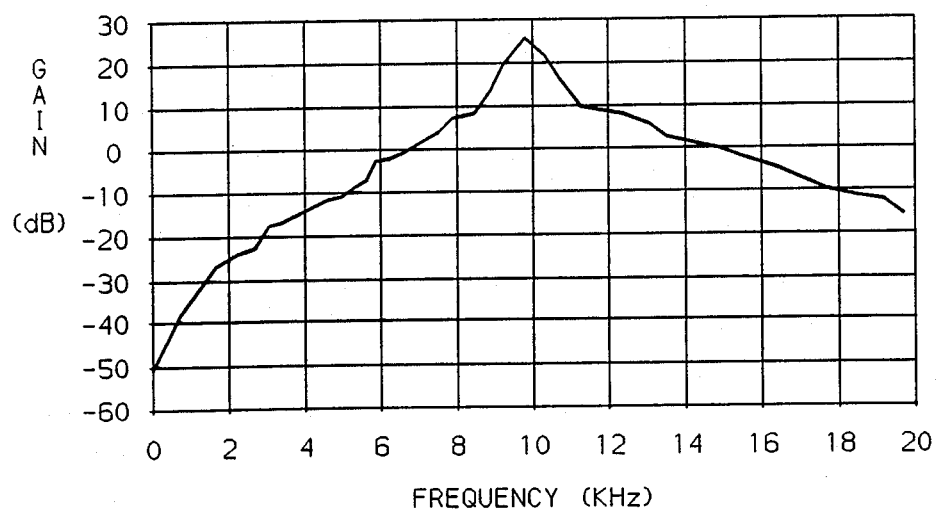
FIG. 7 is a graph of the overall 10 kHz bandpass response of the cascaded notch and variable gain bandpass filters of FIGS. 6 and 8.
Figure 6:
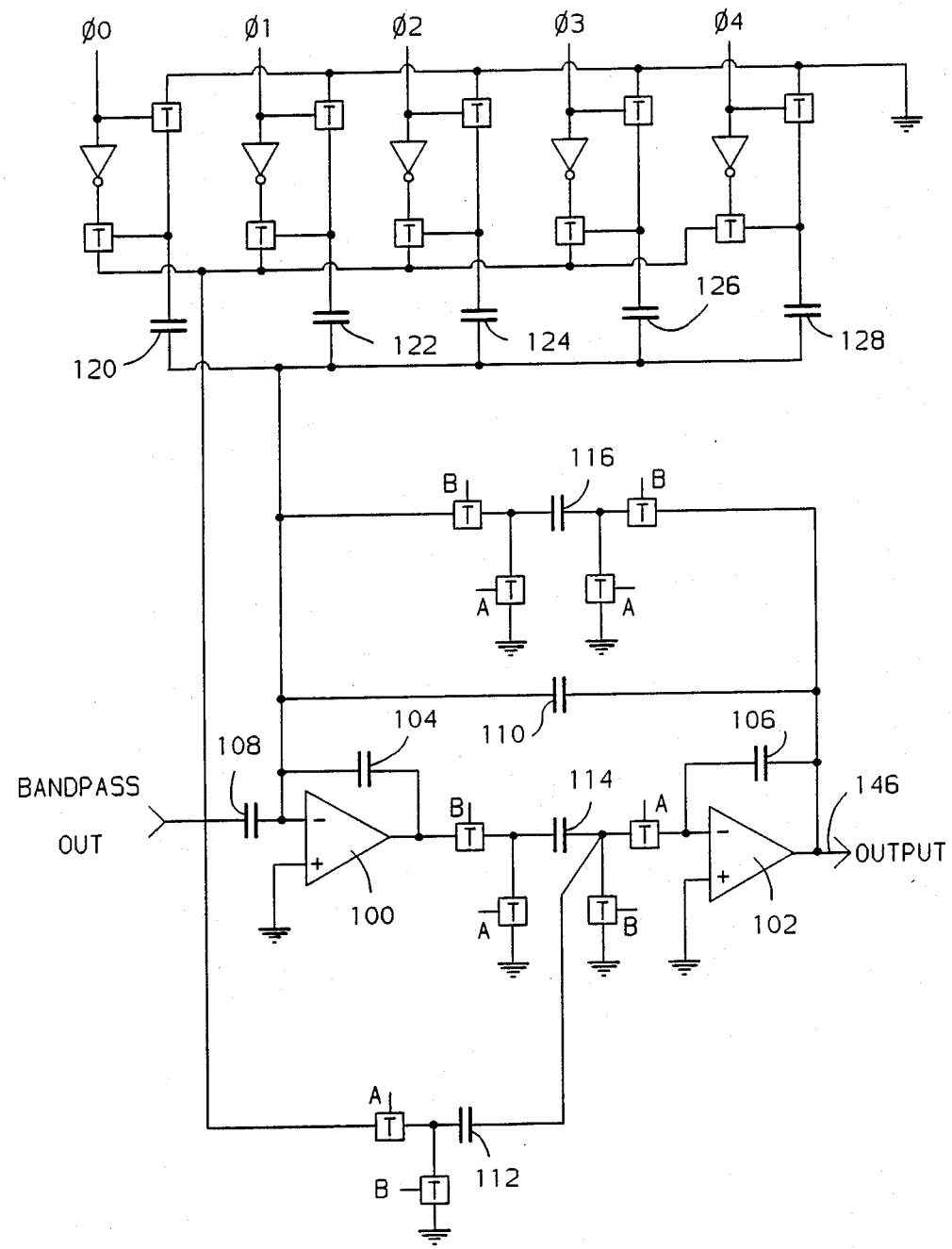

Referring now to FIG. 6 the variable gain bandpass filter 14 is disclosed in greater detail to comprise amplifiers 100 and 102 with feedback capacitors 104 and 106 respectively having values of 3.88 pf and 3.09 pf respectively. A 0.107 pf capacitor 108 connects the bandpass output of the notch filter 12, to the negative input of the amplifier 100. A 0.141 pf capacitor 110 connects the output of the amplifier 102 to the input of amplifier 100. Capacitors 112, 114 and 116 are controlled through electronic switches by the 45 kHz clock signals A, B as indicated. The gain of this filter is controlled through a bank of capacitors 120–122 having values of 0.107 pf, 0.214 pf, 0.428 pf, 0.856 pf and 1.71 pf respectively. The capacitors 120–122 are selectively connected in parallel with the capacitor 108 by the 5 bit output of the counter 44. A 00000 output produces the lowest gain and a 11111 output produces the highest gain. The gain may be varied from a maximum of 26 dB to a minimum of 0 dB in order to keep the loop gain constant under all 10 kHz noise input levels. The filter 14 has a Q=35 and the cascaded 10 kHz bandpass response from the variable Q bandpass filter of the notch and the variable gain bandpass filter is shown in FIG. 7 for the maximum gain case.

Figure 8:
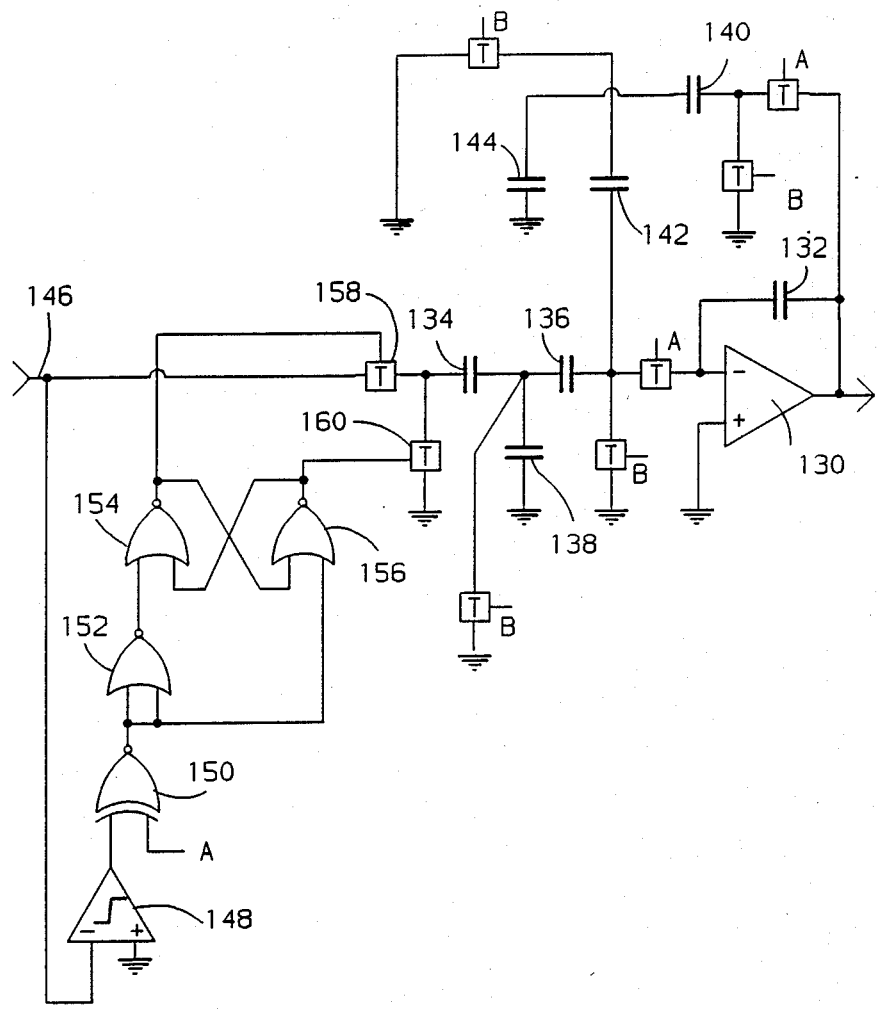

Referring now to FIG. 8, the rectifier/low pass filter block 16 of FIG. 1 is shown in greater detail to include a first order low pass section comprising an amplifier 130 and 17 pf feedback capacitor 132. Capacitors 134, 136 each having a value of 0.3 pf, a 2 pf capacitor 138, 0.1 pf capacitors 140, 142 and 2 pf capacitor 144 are switched by the 45 kHz clocks A, B as indicated through the usual electronic switches. The AC input, on conductor 146, from the variable gain filter is applied to a comparator which senses whether the signal is above or below mid-supply. The output of the comparator 148 is input with clock A to Exclusive NOR gate 150 whose output is inverted by NOR gate 152 and fed to one input of a latch comprising NOR gates 154, 156. The clocking polarity to the FET switches 158, 160 at the input t the low pass filter is thus toggled, effectively full wave rectifying the input signal. Because of the low pass filter action, the time constant on the dc control signal is approximately 320 mS (2 Hz). This averaging effect is necessary for smooth operation of the control loop. T-networks are used in the low pass filter to achieve the extremely high capacitance ratios needed for the large time constant and reasonable dc offset. The dc voltage at the output of the amplifier 130 is, of course, directly proportional to the amount of AC components at the input 146. As previously mentioned the relative value of the dc control signal is sensed by the window comparator 18 which generates U/D and clock enable signals for the U/D Counter 44 according to the relationship of the input voltage to the upper and lower reference voltages Vmax and Vmin.

The embodiments of the invention in which an exclusive property or privilege is claimed are defined as follows:

1. A switched capacitor notch filter having a predetermined center frequency, and including an integrator section providing a bandpass output and a summer section providing a notch output signal, means for applying a first pair of non overlapping clock signals of a predetermined frequency to said integrator section, means for applying a second pair of non overlapping clock signal having a frequency which is a submultiple of said predetermined frequency to said summer section, said summer section responsive to an input signal and said bandpass output to provide said notch output signal, means responsive to the output of the integrator section for developing a control signal, means responsive to said control signal for varying the amount of coupling between said summer and integrator sections to thereby vary the Q of the notch filter without affecting the center frequency.

2. An adaptive audio processor for attenuating interference in an AM receiver comprising, a switched capacitor notch filter having a 10 kHz center frequency, and including an integrator section providing a 10 kHz bandpass output and a summer section providing a 10 kHz notch output signal, means for applying a first pair of non overlapping clock signals of a predetermined frequency to said integrator section, means for applying a second pair of non overlapping clock signal having a frequency which is a submultiple of said predetermined frequency to said summer section, said summer section responsive to an input signal and said bandpass output to provide said notch output signal, means responsive to the output of the integrator section for developing a control signal, means responsive to said control signal for varying the amount of coupling between said summer and integrator sections to thereby vary the Q of the notch filter without affecting the center frequency.

3. A switched capacitor notch filter having a predetermined center frequency, and including an integrator section and a summer section, a first pair of non overlapping clock signals of a predetermined frequency for operating said integrator section to provide a bandpass output containing components of an input signal applied thereto within a band of frequencies centered about said center frequency, a second pair of non overlapping clock signals having a frequency which is a submultiple of said predetermined frequency for operating said summer section, said summer section responsive to said input signal and said bandpass output to provide a notch output signal rejecting said band of frequencies, means responsive to the output of the integrator section for developing a control signal, means for applying said control signal to vary the amount of coupling between said summer and integrator sections to vary the Q of the notch filter.

4. An adaptive audio processor for attenuating interference in an AM receiver comprising,
a switched capacitor notch filter having a predetermined center frequency and including an integrator section and a summer section, means applying a first pair of non overlapping clock signals of a predetermined frequency to said integrator section to provide a bandpass output containing components of an audio input signal applied thereto within a band of frequencies centered about said center frequency, means applying a second pair of non overlapping clock signals having a frequency which is a submultiple of said predetermined frequency to said summer section, said summer section responsive to said audio input signal and said bandpass output to provide an audio output signal rejecting said band of frequencies, a variable gain switched capacitor bandpass filter responsive to the bandpass output of said notch filter, means applying said second pair of clock signals to said variable gain filter, rectifier means responsive to the output of the variable gain filter for producing a dc control signal proportional to the amplitude of the center frequency component in said audio input signal means responsive to said dc control signal for producing a bit pattern, means responsive to said bit pattern for varying the gain of said variable gain filter and the selectivity of said notch filter.

5. An adaptive audio processor for attenuating interference in an AM receiver comprising, a notch filter having a predetermined center frequency, said notch filter being responsive to an audio input signal and providing an audio output signal rejecting a narrow band of frequency components on either side of said center frequency, said notch filter including bandpass filter means providing a bandpass output containing components of the audio input signal within a narrow band of frequencies centered about said center frequency, said notch filter including a summer section and an integrator section, means applying a first pair of non overlapping clock signals of a predetermined frequency to said integrator section, means applying a second pair of non overlapping clock signals having a frequency which is a submultiple of said predetermined frequency to said summer section, a second bandpass filter responsive to the bandpass output of the notch filter, rectifier and lowpass filter means responsive to the output of the second bandpass filter for producing a dc control signal proportional thereto, means applying said second pair of clock signals to said second bandpass filter and said lowpass filter, window comparator means responsive to said dc control signal for producing a counter direction control output and a counter clock control output, an up/down counter controlled by said comparator outputs to produce a bit pattern output which varies the gain of said second bandpass filter and the selectivity of said notch filter without affecting the center frequency of the notch filter.

6. A switched capacitor notch filter having a predetermined center frequency, and including an integrator section providing a bandpass output and a summer section providing a notch output, a variable gain bandpass filter responsive to said bandpass output, rectifier and lowpass filter means responsive to the output of the variable gain bandpass filter for producing a dc control signal proportional thereto, window comparator means responsive to said dc control signal for producing a counter direction control output and a counter clock control output, means for applying a first pair of non overlapping clock signals of a predetermined frequency to said integrator section, means for applying a second pair of non overlapping clock signals having a frequency which is a submultiple of said predetermined frequency to an summer section and said variable gain filter and said lowpass filter, said summer section responsive to said input signal and said bandpass output to provide said notch output signal, an up/down counter controlled by said comparator outputs to produce a bit pattern output which varies the gain of said variable gain bandpass filter and the selectivity of said notch filter.

* * * * *